United States Patent
Oshima et al.

(10) Patent No.: US 10,571,533 B2
(45) Date of Patent: Feb. 25, 2020

(54) METHOD FOR MANUFACTURING DETECTION COIL FOR MAGNETIC RESONANCE MEASUREMENT

(71) Applicant: JEOL Ltd., Tokyo (JP)

(72) Inventors: Shigetoshi Oshima, Yamagata (JP); Shigenori Tsuji, Tokyo (JP)

(73) Assignee: JEOL Ltd., Tokyo (JP)

(*) Notice: Subject to any disclaimer, the term of this patent is extended or adjusted under 35 U.S.C. 154(b) by 214 days.

(21) Appl. No.: 15/654,049

(22) Filed: Jul. 19, 2017

(65) Prior Publication Data
US 2018/0024207 A1    Jan. 25, 2018

(30) Foreign Application Priority Data

Jul. 20, 2016 (JP) ................................ 2016-142061

(51) Int. Cl.
- *H01L 39/24* (2006.01)
- *G01R 33/34* (2006.01)
- *H01L 39/12* (2006.01)

(52) U.S. Cl.
CPC ...... *G01R 33/34007* (2013.01); *H01L 39/125* (2013.01); *H01L 39/249* (2013.01)

(58) Field of Classification Search
CPC ............ H01L 39/125; H01L 39/249; G01R 33/34007; G01R 33/34061; G01R 33/34023
See application file for complete search history.

(56) References Cited

U.S. PATENT DOCUMENTS

| | | | | |
|---|---|---|---|---|
| 4,584,547 A | * | 4/1986 | Thornton | H01L 39/02 174/125.1 |
| 5,227,364 A | * | 7/1993 | Fujiwara | C23C 14/087 257/31 |
| 5,276,398 A | * | 1/1994 | Withers | G01R 33/34 324/318 |
| 5,306,521 A | * | 4/1994 | Shimizu | H01L 39/2493 216/3 |

(Continued)

FOREIGN PATENT DOCUMENTS

| | | |
|---|---|---|
| JP | 2001505463 A | 4/2001 |
| JP | 200653020 A | 2/2006 |

(Continued)

OTHER PUBLICATIONS

Takanasi et al.; Magnetic Field Dependence of Surface Resistance of YBCO Thin Film Irradiated with Si Ions; Proceedings of 63rd Spring Academic Lectures; Japan Society of Applied Physics; Mar. 3, 2016; p. 9-17.

(Continued)

*Primary Examiner* — Paul D Kim
(74) *Attorney, Agent, or Firm* — The Webb Law Firm

(57) ABSTRACT

A manufacturing method includes forming a superconductive thin-film layer on a substrate and processing the superconductive thin-film layer into a shape of a detection coil for magnetic resonance measurement. Accordingly, a superconductive thin-film layer having the detection coil shape can be formed. The method further includes irradiating the shape-processed superconductive thin-film layer with ions. Accordingly, lattice defects serving as pinning can be formed in the superconductive thin-film layer.

9 Claims, 15 Drawing Sheets

(56) References Cited

U.S. PATENT DOCUMENTS

| | | | |
|---|---|---|---|
| 5,548,130 A * | 8/1996 | Shimizu | G01R 33/0354 |
| | | | 257/31 |
| 6,169,399 B1 | 1/2001 | Zhang et al. | |
| 6,541,789 B1 * | 4/2003 | Sato | H01L 39/225 |
| | | | 257/31 |
| 8,093,898 B2 * | 1/2012 | Yusa | G01R 33/28 |
| | | | 324/309 |
| 8,779,768 B2 * | 7/2014 | Brey | G01R 33/38 |
| | | | 324/307 |
| 9,316,708 B2 * | 4/2016 | Eberler | A61B 5/0555 |
| 2006/0033498 A1 | 2/2006 | Saitoh et al. | |
| 2007/0179063 A1 * | 8/2007 | Malozemoff | H01L 39/143 |
| | | | 505/329 |
| 2013/0178366 A1 | 7/2013 | Withers | |
| 2013/0178367 A1 | 7/2013 | Tsuji et al. | |
| 2013/0328564 A1 | 12/2013 | Brey et al. | |
| 2014/0055138 A1 | 2/2014 | Takegoshi et al. | |

FOREIGN PATENT DOCUMENTS

| | | | |
|---|---|---|---|
| JP | 2012199235 A | | 10/2012 |
| JP | 2013100218 A | * | 5/2013 |
| JP | 2013100218 A | | 5/2013 |
| JP | 2013140128 A | | 7/2013 |
| JP | 2013140139 A | | 7/2013 |
| JP | 201441103 A | | 3/2014 |

OTHER PUBLICATIONS

Office Action issued in JP2016-142061 dated Jan. 7, 2020.

* cited by examiner

METHOD FOR MANUFACTURING DETECTION COIL FOR MAGNETIC RESONANCE MEASUREMENT

CROSS REFERENCE TO RELATED APPLICATION

The entire disclosure of Japanese Patent Application No. 2016-142061 filed on Jul. 20, 2016 including the specification, claims, drawings, and abstract, is incorporated herein by reference in its entirety.

TECHNICAL FIELD

The present disclosure relates to a method for manufacturing a detection coil for magnetic resonance measurement, and more particularly relates to a method for manufacturing a detection coil made of a superconductor.

BACKGROUND

Nuclear magnetic resonance (NMR) measuring apparatuses and electron spin resonance (ESR) measuring apparatuses are conventionally known as representative magnetic resonance measuring apparatuses. Magnetic resonance imaging (MRI) apparatuses are known as being similar to the NMR measuring apparatuses. Hereinafter, the NMR measuring apparatus will be described in detail below.

NMR is a phenomenon caused by atomic nuclei placed in a static magnetic field that interact with electromagnetic waves of specific frequencies. The NMR measuring apparatus is an apparatus capable of utilizing such a phenomenon to measure a sample at the atomic level. The NMR measuring apparatus can be practically used in analyses of organic compounds (e.g., chemicals and pesticides), high polymer materials (e.g., vinyl and polyethylene), and biological materials (e.g., nucleic acids and proteins). For example, the NMR measuring apparatus enables a user to examine the molecular structure of a sample.

The NMR apparatus includes an NMR probe (i.e., a probe for NMR signal detection) placed together with a sample in a superconducting magnet that generates a static magnetic field. The NMR probe includes a detection coil for transmission and reception. The detection coil has a function of applying a variable magnetic field to the sample in a transmission state and a function of receiving an NMR signal from the sample in a reception state. The resonance frequency is variable depending on an observation target nuclide. Therefore, in the measurement of the sample, a high-frequency signal having a particular frequency adapted to the observation target nuclide is given to the coil.

By the way, the surface resistance of a superconductor thin film is approximately two or three orders of magnitude lower than that of a normally conductive metal. Therefore, it is expected that the measurement sensitivity can be improved and the measurement time can be shortened if the detection coil is made of a superconductor. Further, the surface resistance of the superconductor thin film can be lowered in the magnetic field by introducing artificial pins (which may be referred to as "pinning centers") in the superconductor thin film. The artificial pins are, for example, lattice defects, oxide fine particles, and the like, which do not interact with an intersecting magnetic flux in such a way as to keep the magnetic flux away. Introducing the artificial pins in the superconductive detection coil enables the magnetic flux to enter the artificial pins in the magnetic field. Therefore, the surface resistance of the detection coil can be lowered and the detection sensitivity can be improved.

As discussed in Japanese Patent Application Laid-Open No. 2013-140128, it is conventionally known that artificial pins can be formed in a superconductor by irradiating the superconductor with heavy ions.

As discussed in Japanese Patent Application Laid-Open No. 2012-199235, it is conventionally known that artificial pins can be formed in a superconductive thin film by irradiating the superconductive thin film with argon ions.

As discussed in Japanese Patent Application Laid-Open No. 2013-100218, it is conventionally known that artificial pins can be formed in a superconductive film by irradiating the superconductive film with ions.

When artificial pins are formed in a superconductor, it is usually difficult to finely process the superconductor. Therefore, it is difficult to process the superconductor including the artificial pins formed therein into a detection coil having a desired shape.

The present disclosure relates to a method for manufacturing a detection coil made of a superconductor and usable for magnetic resonance measurement, and the present disclosure intends to manufacture a detection coil having a lower surface resistance in the magnetic field and facilitate the processing into a desired shape of the detection coil.

SUMMARY

A method for manufacturing a detection coil for magnetic resonance measurement according to the present disclosure includes forming a superconductive thin-film layer on a substrate, processing the superconductive thin-film layer into a shape of the detection coil for magnetic resonance measurement, and irradiating the shape-processed superconductive thin-film layer with ions.

According to the above-mentioned method, lattice defects serving as artificial pins can be formed in the superconductive thin-film layer by ion irradiation. Accordingly, a detection coil having a lower surface resistance in the magnetic field can be manufactured. Further, the method can facilitate the processing into the shape of the detection coil, because the superconductive thin-film layer is processed beforehand into the shape of the detection coil and is subsequently irradiated with ions, as compared to a case where the superconductive thin-film layer is irradiated beforehand with ions and then the superconductive thin-film layer is processed into the shape of the detection coil.

For example, $YBa_2Cu_3O_7$(YBCO, Y123) can be used as a material of the superconductive thin film, although another material is usable. Further, the type of ion is, for example, heavy ions. For example, at least one type of ion can be selected from among the group of ions whose atomic number is 5 to 80. Needless to say, another type of ion can be used if it is useful in forming lattice defects serving as artificial pins in the superconductive thin film. The artificial pins can be arranged one-dimensionally, two-dimensionally, or three-dimensionally in the superconductive thin-film layer. Further, the artificial pins can be arranged regularly or randomly. The artificial pins can be configured to be, for example, rectangular, spherical, tubular, or the like. An artificial pin having another shape can be formed. It is desired that the distribution of artificial pins is entirely uniform in the superconductive thin-film layer. Employing such distribution is effective in uniformly lowering the surface resistance of the detection coil in the entire region of the detection coil.

It may be useful that an insulating protective layer is formed on the shape-processed superconductive thin-film layer before ion irradiation. According to such a configuration, deterioration of the superconductive thin-film layer can be prevented or suppressed, because the insulating protective layer can protect the shape-processed superconductive thin-film layer. According to such a configuration, it is feasible to shorten the time during which the superconductive thin-film layer is exposed; namely, the time during which the superconductive thin-film layer is not protected by the insulating protective layer and therefore deterioration of the superconductive thin-film layer can be prevented or further suppressed, as compared to a case where a superconductive thin-film layer is processed into a shape of the detection coil and irradiated with ions without forming any insulating protective layer and subsequently the insulating protective layer is formed on the superconductive thin-film layer. For example, deterioration due to moisture or the like can be prevented or suppressed.

It may be useful that the shape-processed superconductive thin-film layer is irradiated with ions and then the insulating protective layer is formed on the superconductive thin-film layer.

The insulating protective layer can be a resin layer.

The insulating protective layer can be formed on the entire surface of the superconductive thin-film layer.

It may be useful that the manufacturing method includes forming a metal protective layer on the superconductive thin-film layer before shape processing, processing the metal protective layer and the superconductive thin-film layer into the shape of the detection coil, and subsequently peeling off the shape-processed metal protective layer. According to such a configuration, deterioration of the superconductive thin-film layer can be prevented or suppressed, because the metal protective layer protects the superconductive thin-film layer not subjected to the shape processing.

It may be useful that the manufacturing method includes processing the superconductive thin-film layer formed on the substrate into the shape of a pair of detection coils, and irradiating two of the shape-processed superconductive thin-film layers together with ions in such a way as to form a pair of detection coils for magnetic resonance measurement. According to such a configuration, it is feasible to manufacture a pair of detection coils possessing substantially the same characteristics.

It may be useful that the manufacturing method includes forming a group of randomly and three-dimensionally dispersed defects in the superconductive thin-film layer by ion irradiation. According to such a configuration, the surface resistance of the detection coil in the magnetic field can be further lowered, as compared to a case where the group of defects is regularly dispersed.

According to the present disclosure, in a method for manufacturing a detection coil made of a superconductor and usable for magnetic resonance measurement, it is feasible to manufacture a detection coil having a lower surface resistance in the magnetic field and facilitate the processing into a desired shape of the detection coil.

BRIEF DESCRIPTION OF DRAWINGS

Embodiment(s) of the present disclosure will be described by reference to the following figures, wherein.

DESCRIPTION OF EMBODIMENTS

Hereinafter, a method for manufacturing a detection coil for magnetic resonance measurement according to an embodiment of the present disclosure will be described in detail below. The detection coil for magnetic resonance measurement can be used, for example, in an NMR apparatus and can serve as a coil capable of imparting a variable magnetic field to a sample during transmission and detecting an NMR signal of the sample during reception.

Figure 1:
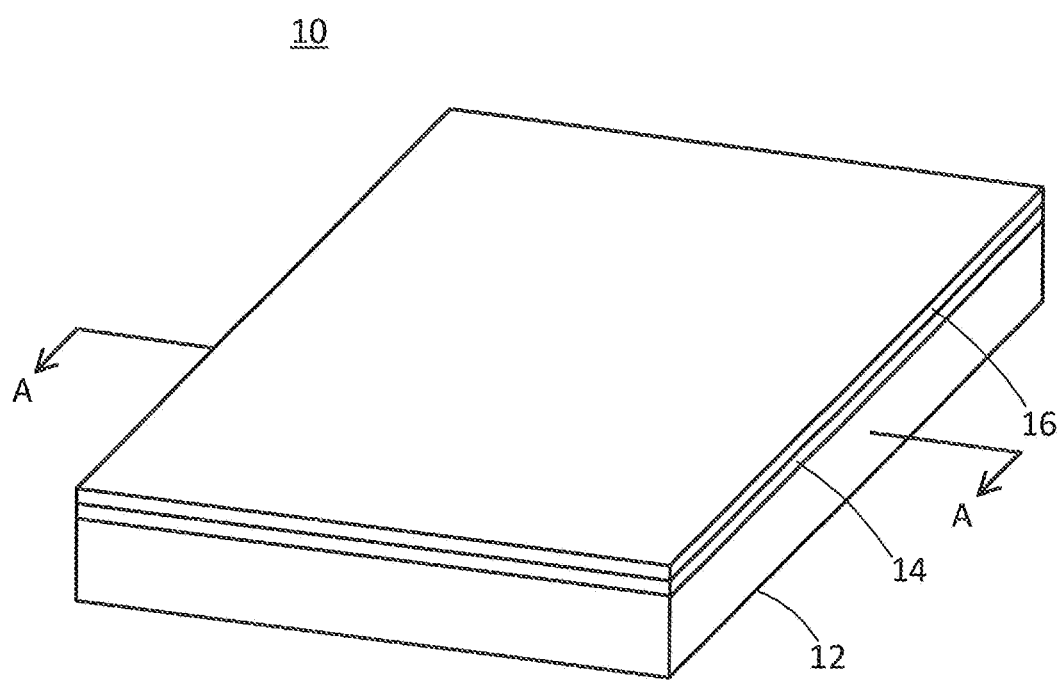
FIG. 1 is a perspective view illustrating a multi-layered substrate according to an embodiment of the present disclosure.

FIG. 1 illustrates an example of a multi-layered substrate according to the present embodiment, which can be used in manufacturing of a detection coil. An illustrated multi-layered substrate 10 includes a substrate 12, a superconductive thin-film layer 14 laminated on a substrate 12, and a metal protective layer 16 laminated on the superconductive thin-film layer 14. The substrate 12 is, for example, a sapphire substrate. The thickness of the substrate 12 is, for example, 0.5 mm. Needless to say, a substrate other than the sapphire substrate can be used as the substrate 12. The substrate 12 can be configured to have any appropriate thickness other than 0.5 mm. As an exemplary material of the superconductive thin-film layer 14, YBa2Cu3O7 (YBCO, Y123) can be cited. The thickness of the superconductive thin-film layer 14 is, for example, 300 nm. Needless to say, another superconductive material can be used to constitute the superconductive thin-film layer 14. The superconductive thin-film layer 14 can be configured to have any appropriate thickness other than 300 nm. The metal protective layer 16 is made of, for example, gold (Au). The thickness of the metal protective layer 16 is, for example, 300 nm. Providing the metal protective layer 16 on the superconductive thin-film layer 14 can prevent or suppress deterioration of the superconductive thin-film layer 14 due to moisture or the like. Any appropriate metal other than gold (Au) can be used to constitute the metal protective layer 16. It is important that the thickness of the metal protective layer 16 is sufficient to prevent or suppress the deterioration of the superconductive thin-film layer 14. Therefore, the metal protective layer 16 may have another appropriate thickness other than 300 nm. Further, a buffer layer, which is made of CeO or the like, can be provided between the substrate 12 and the superconductive thin-film layer 14. Each film included in the multi-layered substrate 10 can be formed according to a conventionally known film forming method, such as sputtering or CVD. For example, the superconductive thin-film layer 14 is formed on the substrate 12 according to the conventionally known film forming method and then the metal protective layer 16 is formed on the superconductive thin-film layer 14 according to the conventionally known film forming method. In some cases, it may be unnecessary to form the metal protective layer 16.

Figure 2A:
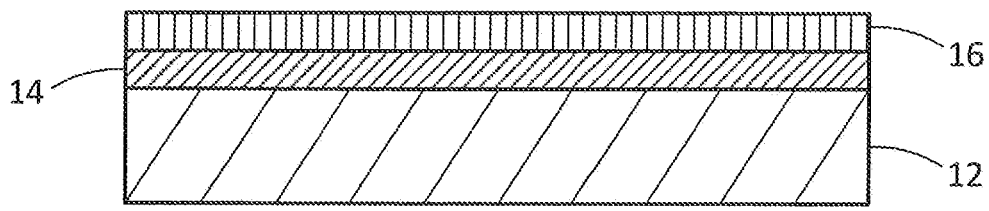
FIG. 2A is a cross-sectional view illustrating a step of a method for manufacturing a detection coil for magnetic resonance measurement according to the present embodiment.
Figure 2B:
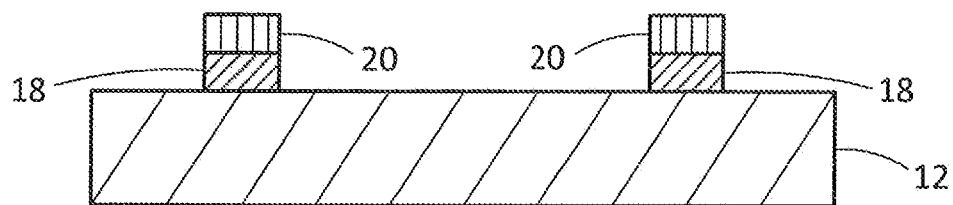
FIG. 2B is a cross-sectional view illustrating a step of the method for manufacturing the detection coil for magnetic resonance measurement according to the present embodiment.

Next, a detection coil manufacturing method according to the present embodiment will be described with reference to FIGS. 2A to 2E. FIG. 2A is a cross-sectional view taken along a line A-A illustrated in FIG. 1. FIG. 2A illustrates a cross section of the multi-layered substrate 10. The manufacturing method includes a step of fine processing the superconductive thin-film layer 14 and the metal protective layer 16 into a shape of the detection coil for magnetic resonance measurement, for example, by dry etching. FIG. 2B illustrates a cross section of a superconductive thin-film layer 18 and a metal protective layer 20, which have been obtained through the fine processing. The fine-processed superconductive thin-film layer 18 has the shape of the detection coil.

Figure 2C:
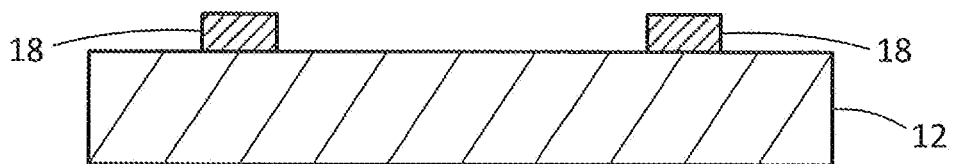
FIG. 2C is a cross-sectional view illustrating a step of the method for manufacturing the detection coil for magnetic resonance measurement according to the present embodiment.

Next, as illustrated in FIG. 2C, the manufacturing method includes a step of peeling off the metal protective layer 20. For example, a solution such as an ethylene diamine tetraacetic acid solution (EDTA solution) or the like can be used in peeling off the metal protective layer 20. Alternatively, the metal protective layer 20 can be peeled off by a dry process.

Figure 3:
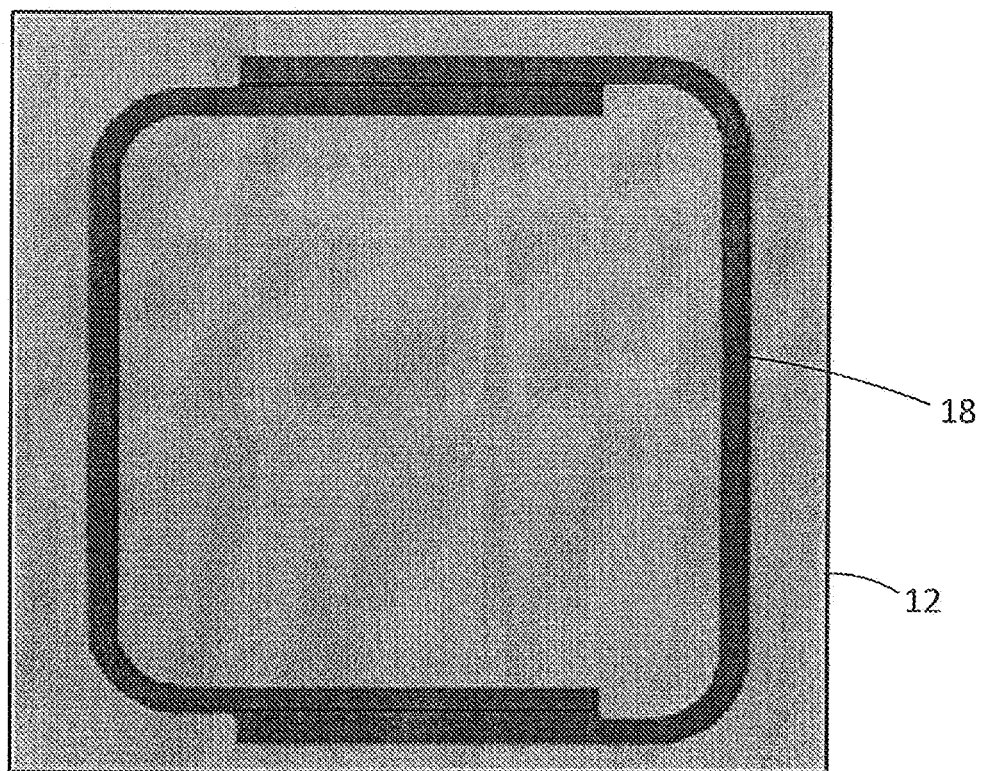
FIG. 3 is a top view illustrating a shape-processed superconductive thin-film layer.

FIG. 3 illustrates the substrate 12 from which the metal protective layer 20 has been removed. FIG. 3 is a plan view illustrating the substrate 12. The superconductive thin-film layer 18 is formed as a coil pattern on the substrate 12 through the above-mentioned fine processing and includes an inductance element L and a capacitance element C. Configuring an LC resonance circuit is feasible by employing the above-mentioned configuration. The coil pattern illustrated in FIG. 3 is a mere example. A pattern having any appropriate shape, other than the illustrated coil pattern, can be formed.

Figure 2D:
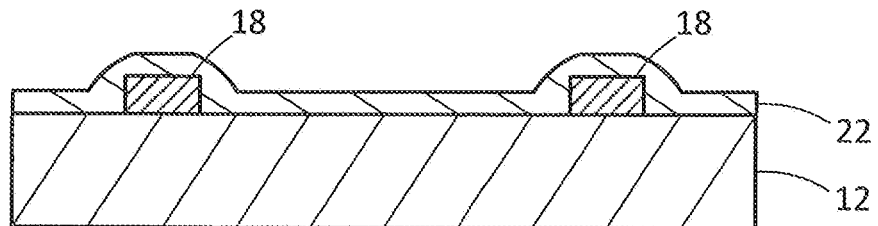
FIG. 2D is a cross-sectional view illustrating a step of the method for manufacturing the detection coil for magnetic resonance measurement according to the present embodiment.

Next, as illustrated in FIG. 2D, the manufacturing method includes a step of forming an insulating protective layer 22 on the substrate 12 and the superconductive thin-film layer 18. For example, the formation of the insulating protective layer 22 covers the entire surface of the substrate 12 and the superconductive thin-film layer 18. The film forming method is, for example, a conventionally known film forming method, such as sputtering or spin coating. Providing the insulating protective layer 22 on the superconductive thin-film layer 18 can prevent or suppress deterioration of the superconductive thin-film layer 18 due to moisture or the like. The insulating protective layer 22 can be configured, for example, by an appropriate resin, such as fluororesin. The thickness of the insulating protective layer 22 is, for example, 200 nm to 300 nm. The insulating protective layer 22 can be configured to have a thickness that is effective to prevent or suppress the deterioration of the superconductive thin-film layer 18. Therefore, the insulating protective layer 22 may have another appropriate thickness other than 200 nm to 300 nm.

Figure 2E:
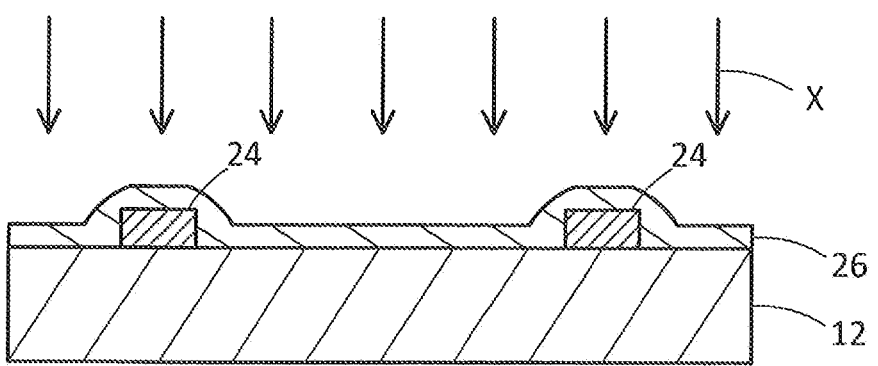
FIG. 2E is a cross-sectional view illustrating a step of the method for manufacturing the detection coil for magnetic resonance measurement according to the present embodiment.

Next, as illustrated in FIG. 2E, the manufacturing method includes a step of irradiating the superconductive thin-film layer 18 with ions that come from the side of the insulating protective layer 22. Reference symbol X schematically indicates an exemplary state of the ion irradiation. The emitted ions pass through the insulating protective layer 22 and reach the inside of the superconductive thin-film layer 18. Accordingly, lattice defects serving as pinning can be formed in the superconductive thin-film layer 18. A superconductive thin-film layer 24 is a layer in which the pinning is formed by ion irradiation. Further, defects can be formed in the insulating protective layer 22 through the ion irradiation. An insulating protective layer 26 is a layer in which the defects are formed through the ion irradiation. For example, the entire surface of the substrate 12 is irradiated with ions. Accordingly, the formation of the pinning is carried out in the entire region of the superconductive thin-film layer 24. The ions used for the irradiation are heavy ions, such as at least one type of ions selected from a group of ions whose atomic numbers are 5 to 80. The irradiation energy is, for example, 0.5 to 10 MeV. The thickness of the insulating protective layer 22, the irradiation energy, the type of ions, particle density of the ions, and the like are selectively determined so that the pinning can be formed by the ions passing through the insulating protective layer 22 and reaching the inside of the superconductive thin-film layer 18.

Artificial pins in the superconductive thin-film layer 24 can be arranged one-dimensionally, namely linearly, or two-dimensionally, namely planarly, or can be arranged three-dimensionally. Further, the artificial pins can be arranged regularly to form a one-dimensional pattern, a two-dimensional pattern, or a three-dimensional pattern. Alternatively, the artificial pins can be arranged randomly. Arranging the artificial pins randomly is advantageous in that the surface resistance of the detection coil can be further reduced, as compared to a case where the artificial pins are arranged regularly. Further, the shape of each artificial pin is, for example, rectangular, spherical, tubular, or the like. Needless to say, an artificial pin having another shape can be formed.

The superconductive thin-film layer 24, in which the pinning has been formed, can be used as a detection coil in a state where the superconductive thin-film layer 24 is laminated on the substrate 12. For example, the substrate 12 can be attached to the interior of the NMR probe by means of a jig. Accordingly, the detection coil constituted by the superconductive thin-film layer 24 can be disposed in the NMR probe.

As mentioned above, according to the present embodiment, the superconductive thin-film layer is processed into the shape of the detection coil and subsequently the superconductive thin-film layer is irradiated with ions. As the lattice defects serving as pinning can be formed in the superconductive thin-film layer through the ion irradiation, the surface resistance of the detection coil in the magnetic field can be lowered. Further, as the superconductive thin-film layer is fine-processed beforehand into the shape of the detection coil and subsequently the pinning is formed in the superconductive thin-film layer through the ion irradiation, it is feasible to easily perform the fine processing, as compared to a case where the fine processing is performed after the superconductive thin-film layer is irradiated with ions.

Further, as the insulating protective layer is formed on the fine-processed superconductive thin-film layer and subsequently the ion irradiation is performed, deterioration of the superconductive thin-film layer can be prevented or suppressed, because the insulating protective layer protects the fine-processed superconductive thin-film layer. As the insulating protective layer is formed beforehand on the superconductive thin-film layer and then the ion irradiation is performed, it is feasible to shorten the time during which the superconductive thin-film layer is exposed; namely, the time during which the superconductive thin-film layer is not protected by the insulating protective layer, as compared to a case where the superconductive thin-film layer is fine-processed beforehand into the shape of the detection coil and then the superconductive thin-film layer is irradiated with ions, and subsequently the insulating protective layer is formed on the superconductive thin-film layer. Accordingly, it is feasible to prevent or further suppress the deterioration of the superconductive thin-film layer occurring due to moisture or the like.

Needless to say, the superconductive thin-film layer can be fine-processed into the shape of the detection coil and then irradiated with ions, and subsequently the insulating protective layer can be formed on the superconductive thin-film layer. Even in this case, the surface resistance of the detection coil in the magnetic field can be lowered. Further, the fine processing can be easily performed.

It is useful to measure the surface resistance of the detection coil (i.e., the superconductive thin-film layer 24) in the magnetic field after completing the ion irradiation and then perform the ion irradiation again if a measurement result is undesirable. For example, it may be desirable to perform the ion irradiation a plurality of times until a target surface resistance can be obtained.

When the resin-made insulating protective layer 22 is irradiated with the ions, defects can be formed in the insulating protective layer 22. In this case, the insulating protective layer 22 may be further hardened and accordingly the strength of the insulating protective layer 22 may be enhanced. For example, when the insulating protective layer 22 is irradiated with Si ions, Si elements are dispersedly disposed in the insulating protective layer 22. Accordingly, the strength of the insulating protective layer 22 may be enhanced.

The detection coil manufactured according to the above-mentioned manufacturing method is a detection coil that includes the substrate 12, the coil-shaped superconductive thin-film layer 24 disposed on the substrate 12 and having the pinning (i.e., the lattice defects) formed therein, and the insulating protective layer 26 formed on the substrate 12 and the superconductive thin-film layer 24 and containing the dispersedly disposed elements (e.g., Si atoms) used for the ion irradiation. The detection coil having the above-mentioned configuration can lower the surface resistance in the magnetic field. Further, as the elements (e.g., Si atoms) used for the ion irradiation are dispersedly present in the insulating protective layer 26, the strength of the insulating protective layer 26 may be enhanced and therefore the strength of the detection coil can be enhanced.

Figure 4:
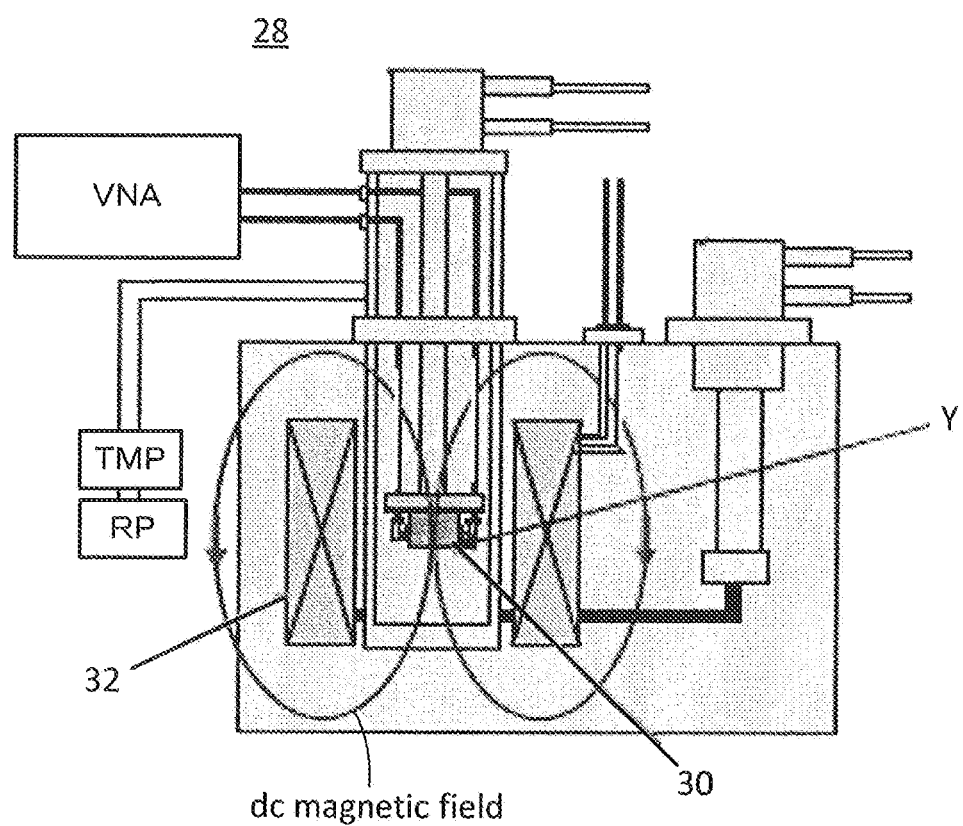
FIG. 4 illustrates a surface resistance measuring apparatus.

The detection coil including the superconductive thin-film layer 24 has the surface resistance in the magnetic field as described below. The surface resistance in the magnetic field can be measured, for example, by a dielectric resonator method. FIG. 4 illustrates an example of a surface resistance measuring apparatus that can implement the dielectric resonator method. An illustrated surface resistance measuring apparatus 28 includes a cavity 30, serving as a sample chamber, disposed in a space where a vacuum state is maintained by a rotary pump RP or a turbo molecular pump TMP. Further, the space is cooled to an extremely low temperature (e.g., 10K to 20K) by a low-temperature cooler. The cavity 30, as a whole, functions as a resonator. A superconductor thin-film layer to be measured is disposed in the cavity 30. As the cavity 30 is located in a static magnetic field generating apparatus 32, a static magnetic field can be formed in the cavity 30. A vector network analyzer (VNA) is provided in the surface resistance measuring apparatus 28. The VNA can measure frequency characteristics in the cavity 30. Accordingly, the surface resistance of the superconductor thin-film layer can be measured. Forming the static magnetic field by the static magnetic field generating apparatus 32 can reproduce an environment similar to that of the NMR apparatus and can measure the surface resistance in the magnetic field.

Figure 5:
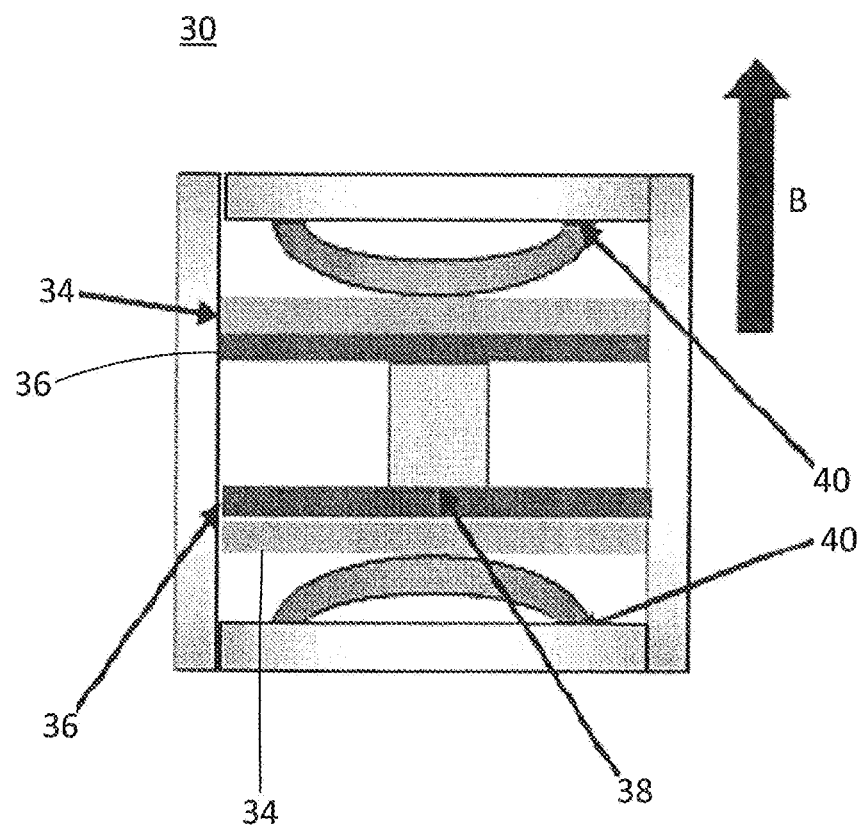
FIG. 5 illustrates a cavity in the surface resistance measuring apparatus.
Figure 6:
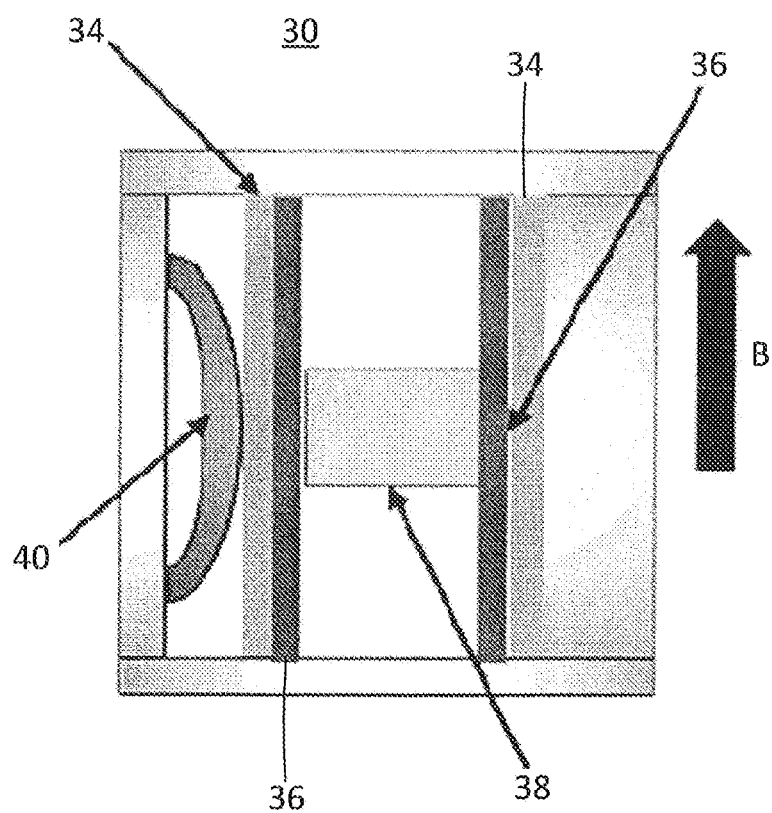
FIG. 6 illustrates the cavity in the surface resistance measuring apparatus.

Hereinafter, the cavity 30 will be described in detail below with reference to FIGS. 5 and 6. FIGS. 5 and 6 are enlarged views of the portion indicated by reference symbol Y in FIG. 4. FIG. 5 illustrates a positional relationship between the cavity 30 and a static magnetic field B, when the applied magnetic field is perpendicular to the superconductive thin film (i.e., the substrate surface). FIG. 6 illustrates a positional relationship between the cavity 30 and the static magnetic field B, when the applied magnetic field is parallel to the superconductive thin film (i.e., the substrate surface).

As illustrated in FIG. 5, in the cavity 30, a pair of copper substrates 34 is disposed in a container in such a way as to face each other and a superconductive thin film 36 (i.e., a sample to be measured) is placed on each copper substrate 34. Accordingly, two superconductive thin films 36 are arranged in such a way as to face each other. Further, a columnar sapphire rod 38 is located between two superconductive thin films 36. The sapphire rod 38 has one end brought into contact with one superconductive thin film 36 and the other end brought into contact with the other superconductive thin film 36. A spring 40 is disposed between each copper substrate 34 and a container wall. The spring 40 resiliently presses the copper substrate 34 (i.e., the superconductive thin film 36) toward the center of the container. Measurement of a change in frequency of microwaves is performed, while emitting the microwaves between two superconductive thin films 36. Accordingly, the surface resistance of the superconductive thin film 36 can be measured.

According to the example illustrated in FIG. 5, the cavity 30 is disposed in the surface resistance measuring apparatus 28 in such a manner that the static magnetic field B formed by the static magnetic field generating apparatus 32 is applied perpendicularly to the superconductive thin film 36 (i.e., the substrate surface). When the measurement is performed in the illustrated state, it is feasible to measure the surface resistance of the superconductive thin film 36 in the state where the static magnetic field B is applied perpendicularly to the superconductive thin film 36.

According to the example illustrated in FIG. 6, the cavity 30 is disposed in the surface resistance measuring apparatus 28 in such a manner that the static magnetic field B formed by the static magnetic field generating apparatus 32 is applied parallel to the superconductive thin film 36 (i.e., the substrate surface). When the measurement is performed in the illustrated state, it is feasible to measure the surface resistance of the superconductive thin film 36 in the state where the static magnetic field B is applied parallel to the superconductive thin film 36.

Hereinafter, measurement results of the surface resistance will be described. The used material of the superconductive thin film is YBCO. The superconductive thin film was irradiated with Si ions (+2 valence); i.e., with the heavy ions, at irradiation energy of 500 keV. The particle density in this case was $4 \times 10^{12}/cm^2$. The temperature in the cavity 30 during the measurement was 20K. The frequency of the microwaves supplied to the cavity 30 was 1 GHz.

Figure 7:
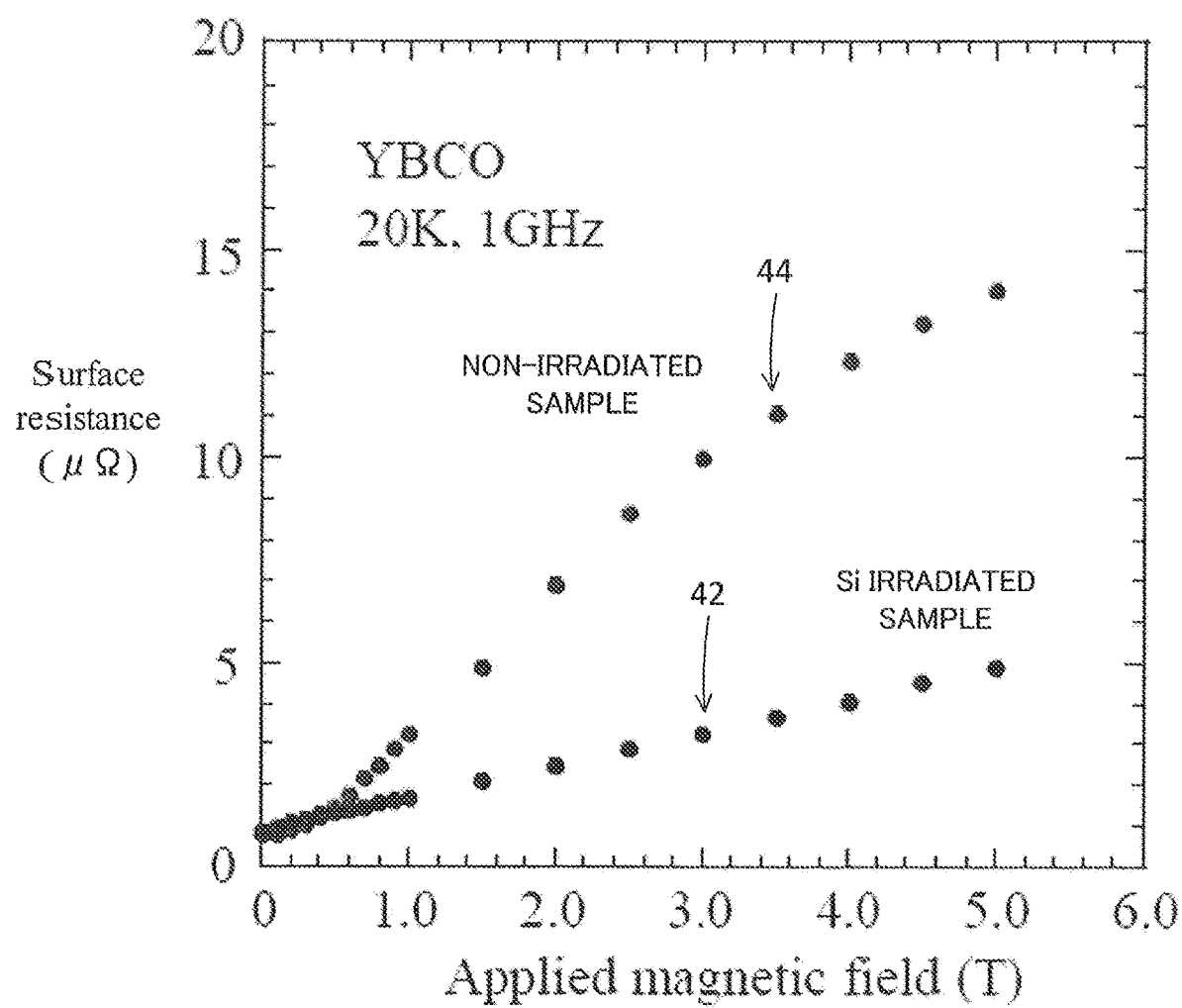
FIG. 7 is a graph illustrating surface resistance values measured when the applied magnetic field is perpendicular to a substrate surface.
Figure 8:
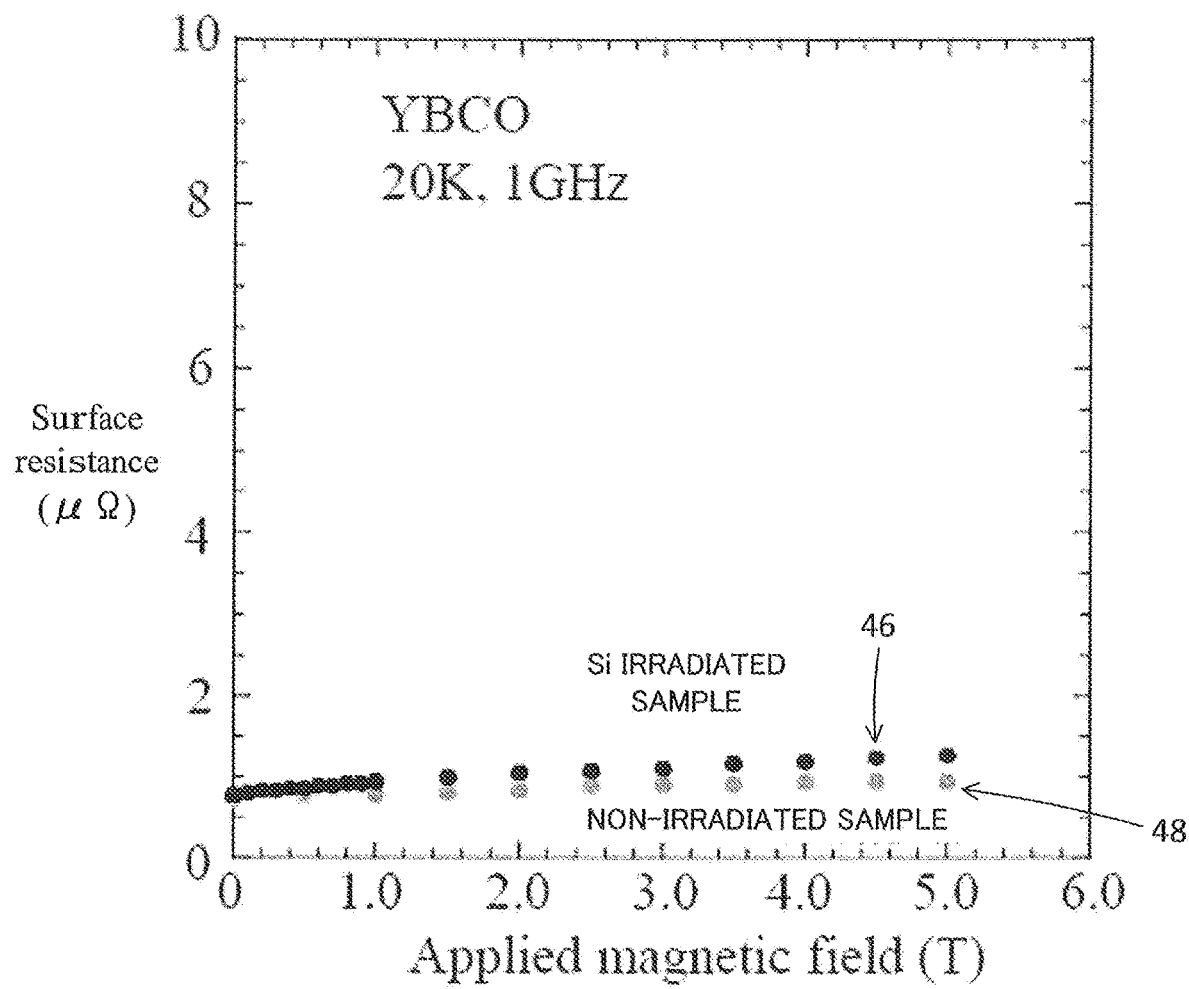
FIG. 8 is a graph illustrating surface resistance values measured when the applied magnetic field is parallel to the substrate surface.

FIGS. 7 and 8 illustrate the measurement results. In FIGS. 7 and 8, the horizontal axis indicates static magnetic field B(T) formed by the static magnetic field generating apparatus 32 and the vertical axis indicates the surface resistance ($\mu\Omega$) of the superconductive thin film.

FIG. 7 illustrates surface resistance values measured in the state illustrated in FIG. 5; namely, surface resistance values measured in a state where the applied static magnetic field B is perpendicular to the superconductive thin film (i.e., the substrate surface). A group of measurement results 42 indicates the surface resistance of the superconductive thin film irradiated with Si ions; namely the surface resistance of the superconductive thin film containing the pinning formed therein. Another group of measurement results 44 indicates the surface resistance of a comparative superconductive thin film not irradiated with Si ions; namely the surface resistance of the superconductive thin film containing no pinning. Regardless of the presence or absence of Si ion irradiation, the surface resistance of the superconductive thin film increases as the static magnetic field B increases. However, the surface resistance of the superconductive thin film irradiated with Si ions is lower than the surface resistance of the superconductive thin film not irradiated with Si ions. In other words, it is feasible to suppress the magnetic field dependence of the surface resistance of the superconductive thin film irradiated with Si ions when the applied static magnetic field B is perpendicular to the superconductive thin film (i.e., the substrate surface).

FIG. 8 illustrates surface resistance values measured in the state illustrated in FIG. 6; namely, surface resistance values measured in a state where the applied static magnetic field B is parallel to the superconductive thin film (i.e., the substrate surface). A group of measurement results 46 indicates the surface resistance of the superconductive thin film irradiated with Si ions; namely, the surface resistance of the superconductive thin film containing the pinning formed therein. Another group of measurement results 48 indicates the surface resistance of a comparative superconductive thin film not irradiated with Si ions; namely, the surface resistance of the superconductive thin film containing no pinning. As is apparent from the comparison between the measurement results 46 and 48, there is no substantial difference in the surface resistance. In other words, there is no or little difference in surface resistance depending on the presence or absence of Si ion irradiation, when the applied static magnetic field B is parallel to the superconductive thin film (i.e., the substrate surface).

In the NMR apparatus, when the disposed detection coil is completely parallel to the static magnetic field B, there is no or little difference in surface resistance depending on the presence or absence of Si ion irradiation as illustrated in FIG. 8. Accordingly, there is no or little difference in detection sensitivity depending on the presence of absence of Si ions irradiation. On the other hand, when the disposed detection coil is inclined relative to the static magnetic field B; namely, when the disposed detection coil is not completely parallel to the static magnetic field B, a vertical component of the static magnetic field B with respect to the detection coil has an influence on the detection coil. For example, when a measurement target is a solid sample, a sample tube accommodating the sample is inclined to an angle having a so-called magic angle and the detection coil is disposed around the sample tube. In this case, the disposed detection coil is not parallel to the static magnetic field, and the vertical component of the static magnetic field with respect to the detection coil has an influence on the detection coil. Due to the influence of the vertical component, the surface resistance of the superconductive thin film not irradiated with Si ions greatly depends on the static magnetic field B and increases as the static magnetic field B increases, as illustrated in FIG. 7. On the other hand, although the surface resistance of the superconductive thin film irradiated with Si ions slightly increases due to the influence of the vertical component when the static magnetic field B increases, the magnetic field dependence can be suppressed and the surface resistance is relatively lower as apparent from FIG. 7. Therefore, constituting the detection coil by the superconductive thin film irradiated with Si ions can improve the detection sensitivity, as compared to a case where the detection coil is constituted by the superconductive thin film not irradiated with Si ions.

Figure 9:
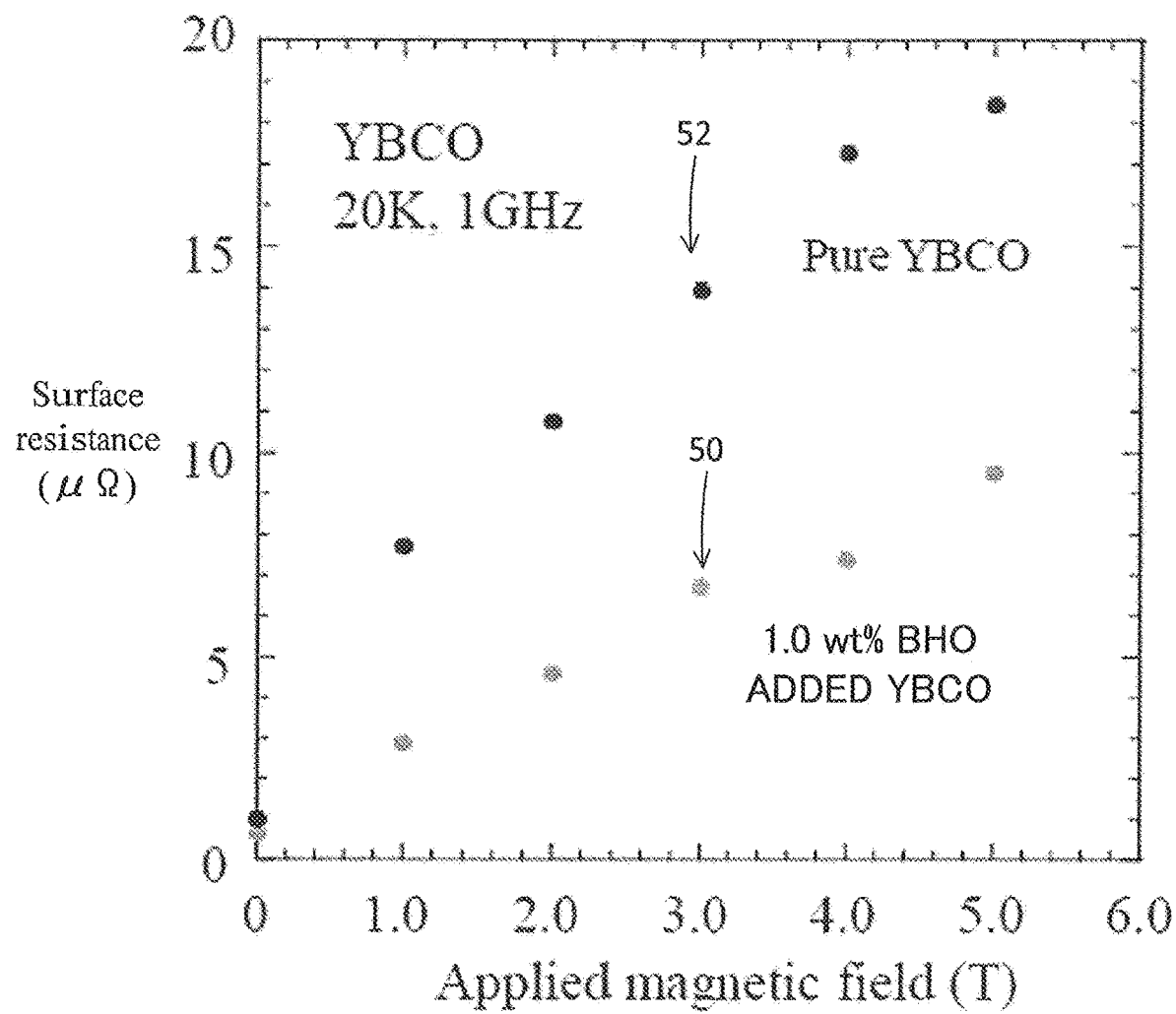
FIG. 9 is a graph illustrating surface resistance values measured when the applied magnetic field is perpendicular to the substrate surface.
Figure 10:
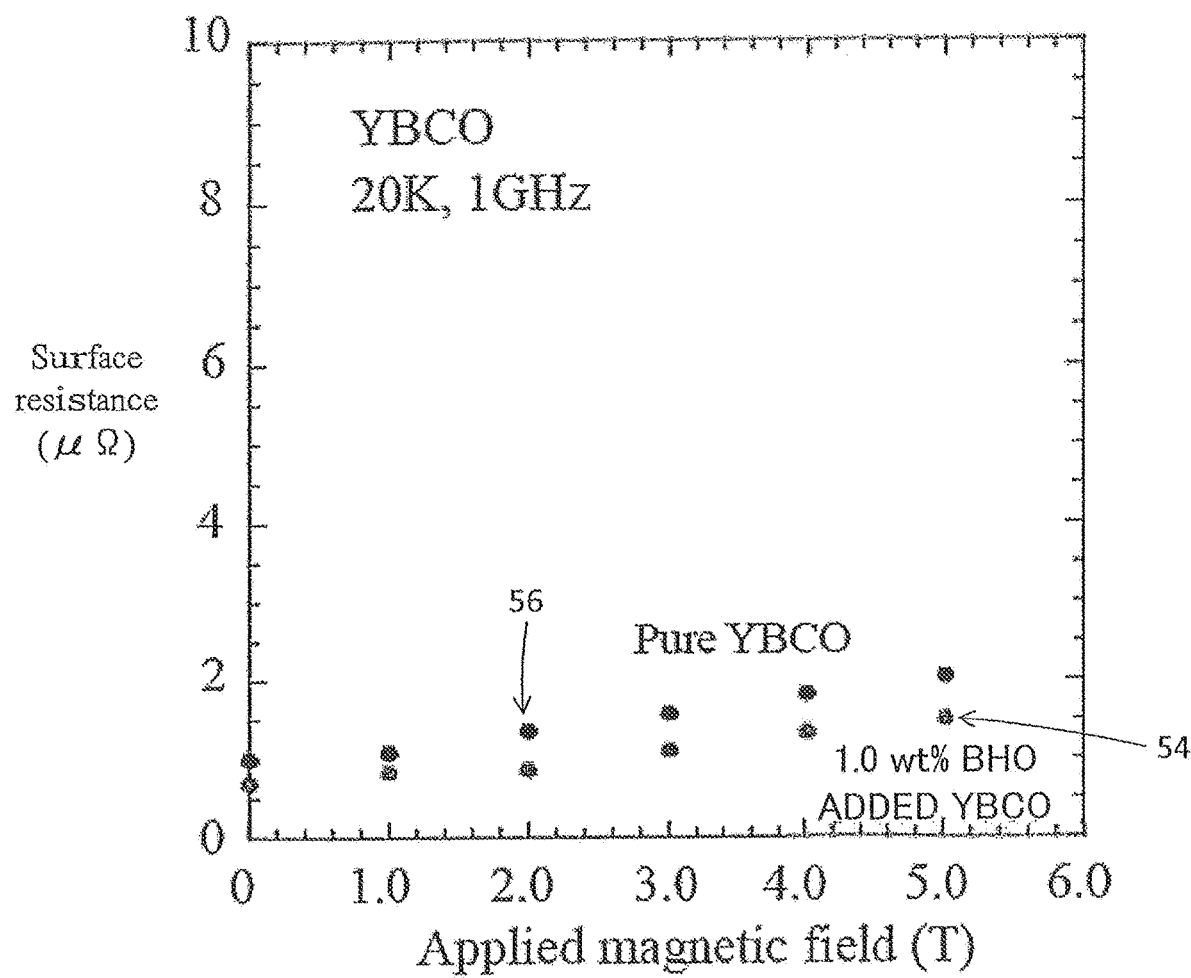
FIG. 10 is a graph illustrating surface resistance values measured when the applied magnetic field is parallel to the substrate surface.

Hereinafter, as a reference example, the surface resistance in a case where oxide fine particles are added to a superconductive thin film (e.g., YBCO thin film) will be described. The oxide fine particles added to the superconductive thin film can function as the pinning. BaHfO3 was used as the added oxide fine particles. The addition amount thereof was 1.0 wt %. FIGS. 9 and 10 illustrate measurement results of the surface resistance. In FIGS. 9 and 10, the horizontal axis indicates the static magnetic field B(T) formed by the static magnetic field generating apparatus 32 and the vertical axis indicates the surface resistance ($\mu\Omega$) of the superconductive thin film.

FIG. 9 illustrates surface resistance values measured in a state where the applied static magnetic field B is perpendicular to the superconductive thin film (i.e., the substrate surface). A group of measurement results 50 indicates the surface resistance of the superconductive thin film containing BaHfO3 fine particles added thereto; namely, the surface resistance of the superconductive thin film containing the pinning formed therein. Another group of measurement results 52 indicates the surface resistance of a comparative superconductive thin film not containing BaHfO3 fine particles; namely, the surface resistance of the superconductive thin film containing no pinning. Regardless of the addition of BaHfO3 fine particles, the surface resistance of the superconductive thin film increases as the static magnetic field B increases. The surface resistance of the superconductive thin film containing BaHfO3 fine particles added thereto is lower than the surface resistance of the superconductive thin film not containing BaHfO3 fine particles. In other words, it is feasible to suppress the magnetic field dependence of the surface resistance of the superconductive thin film containing BaHfO3 fine particles added thereto when the applied static magnetic field B is perpendicular to the superconductive thin film (i.e., the substrate surface).

FIG. 10 illustrates surface resistance values measured in a state where the applied static magnetic field B is parallel to the superconductive thin film (i.e., the substrate surface). A group of measurement results 54 indicates the surface resistance of the superconductive thin film containing BaHfO3 fine particles added thereto; namely, the surface resistance of the superconductive thin film containing the pinning formed therein. Another group of measurement results 56 indicates the surface resistance of the superconductive thin film not containing BaHfO3 fine particles; namely, the surface resistance of the superconductive thin film containing no pinning formed therein. As is apparent from comparison between the measurement results 54 and 56, there is no substantial difference in the surface resistance. In other words, there is no or little difference in surface resistance depending on the addition of BaHfO3 fine particles, when the applied static magnetic field B is parallel to the superconductive thin film (i.e., the substrate surface).

Effects obtainable when the superconductive thin film contains BaHfO3 fine particles added thereto are substantially similar to the effects obtainable when the superconductive thin film is irradiated with Si ions.

Figure 11:
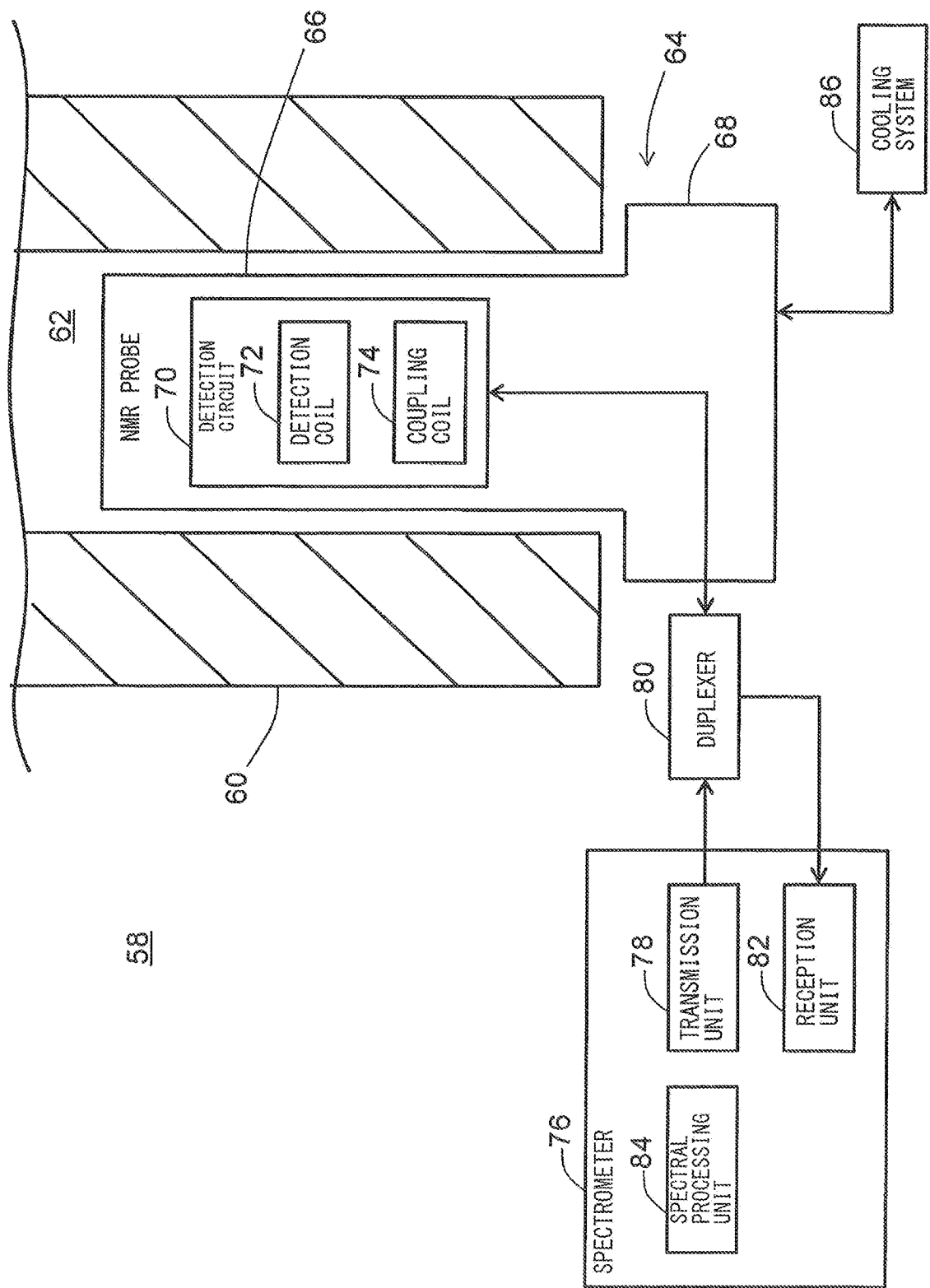
FIG. 11 is a block diagram illustrating an NMR apparatus.

Hereinafter, an NMR apparatus using a detection coil manufactured according to the manufacturing method described in the present embodiment will be described. FIG. 11 illustrates an exemplary NMR apparatus 58. The NMR apparatus 58 is capable of measuring NMR signals generated by observation nuclei contained in a sample.

A static magnetic field generating apparatus 60 can generate a static magnetic field. The static magnetic field generating apparatus 60 includes a bore 62 formed at the central portion thereof. The bore 62 is a cavity extending in the vertical direction. An NMR probe 64 is roughly constituted by an insertion portion 66 and a base portion 68. The insertion portion 66 has a cylindrical shape entirely extending in the vertical direction. The insertion portion 66 can be inserted into the bore 62 of the static magnetic field generating apparatus 60.

The insertion portion 66 includes a probe head in which a detection circuit 70 is provided. The detection circuit 70 is a tuning and matching circuit, which includes electronic devices, represented by a detection coil 72 for detection of the NMR signal, a coupling coil 74 for transmission and reception, a variable capacitor for tuning, and a variable capacitor for matching. The detection coil 72 is a detection coil manufactured according to the manufacturing method described in the present embodiment. The coupling coil 74, which may be referred to as a pickup coil or a transmission/reception coil, can generate a variable magnetic field in an irradiation time zone (i.e., transmission period) and can receive an NMR signal detected by the detection coil 72 in an observation time zone (i.e., reception period). Characteristics of the detection circuit 70 can be optimized by adequately selecting setting values (e.g., capacitances) of the tuning variable capacitor and the matching variable capacitor. In other words, tuning and matching can be realized. As a modified embodiment, the coupling coil 74 can be replaced by appropriate wiring that can realize the transmission and reception by the detection coil 72.

A spectrometer 76 includes a transmission unit 78, which includes a signal generator and a power amplifier to generate and output a transmission signal. In an NMR measurement mode, the natural frequency of an observation target is set as the frequency of the transmission signal. The transmission signal output from the transmission unit 78 can be transmitted to the detection circuit 70 in the NMR probe 64 via a duplexer 80 (i.e., a transmission and reception switching device). As a modified embodiment, the duplexer 80 can be disposed in the NMR probe 64.

A reception unit 82 of the spectrometer 76 can receive the NMR signal (i.e., reception signal) detected by the detection coil 72 via the duplexer 80. The reception unit 82 has a conventionally known circuit configuration including a quadrature detecting circuit and an A/D converter and can perform predetermined processing on the reception signal. The reception signal processed by the reception unit 82 can be transmitted to a spectral processing unit 84. The spectral processing unit 84 can generate a spectral spectrum by performing FFT processing on the reception signal and can perform required analysis on the generated spectrum. The spectrometer 76 includes a display unit (not illustrated) that can display a processing result obtained by the spectral processing unit 84. Further, the spectrometer 76 includes an input unit that enables a user to perform various settings for a measurement target. As a modified embodiment, a computer is employable as the spectral processing unit 84.

A cooling system 86 includes, for example, a refrigerator that can cool helium gas. The cooling system 86 can supply the cooled helium gas to the NMR probe 64. In other words, the cooling system 86 is a system capable of cooling a component to be cooled provided in the NMR probe 64. For example, the component to be cooled can be cooled down to a temperature of 20K or less.

Figure 12:
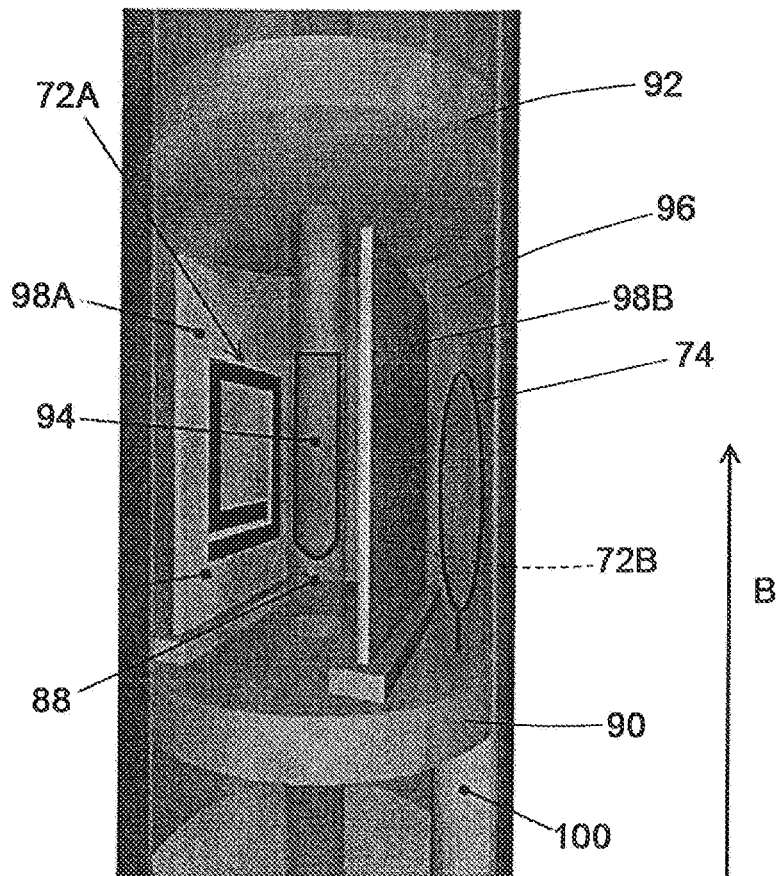
FIG. 12 is a perspective view illustrating a sample chamber and detection coils.

FIG. 12 schematically illustrates a sample chamber and detection coils. The NMR probe 64 has a sample temperature regulation pipe 88 provided in the insertion portion 66. The sample temperature regulation pipe 88 is, for example, a glass tube, which extends through a stage 90, and a probe cap 92. A sample tube 94, in which a sample can be accommodated, is disposed in the sample temperature regulation pipe 88. The insertion portion 66 is disposed in the bore 62 of the static magnetic field generating apparatus 60 in such a manner that the centers of the sample and the sample tube 94 coincide with the center of the static magnetic field. The inside of the sample temperature regulation pipe 88 is an atmospheric space. The inner temperature of the sample temperature regulation pipe 88 can be maintained, for example, at room temperature. Accordingly, the sample is located in the atmospheric space and the temperature of the sample can be maintained at room temperature.

A hermetic chamber 96 is formed between the sample temperature regulation pipe 88 and an outer wall of the insertion portion 66. The hermetic chamber 96 is kept in a vacuum state. The detection circuit 70 (including two detection coils 72A and 72B, the coupling coil 74, the tuning variable capacitor, and the matching variable capacitor) is placed in the vacuumed hermetic chamber 96. The detection coil 72A is a thin-film detection circuit pattern formed on a substrate 98A. Although not illustrated in the drawings, the detection coil 72B is a similar thin-film detection circuit pattern formed on a substrate 98B. The detection coils 72A and 72B are detection coils constituted by superconductive thin films and manufactured according to the manufacturing method described in the present embodiment with reference to FIG. 2A-2E. The substrates 98A and 98B are, for example, sapphire substrates. The sample and the sample tube 94 are positioned between the substrates 98A and 98B. The substrates 98A and 98B are held by a jig for the detection coil in such a manner that the detection coils 72A and 72B are positioned substantially parallel to, or inclined at a predetermined angle relative to, the static magnetic field B formed by the static magnetic field generating apparatus 60.

The detection coil 72A is a coil pattern formed on the substrate 98A and includes an inductance element L and a capacitance element C. Although not illustrated in the drawings, the detection coil 72B similarly includes an inductance element L and a capacitance element C. Configuring an LC resonance circuit is feasible by employing the above-mentioned configuration.

In the above-mentioned configuration, the detection circuit 70 is a component to be cooled and can be cooled down to an extremely low temperature. To improve the S/N ratio of the signal, the variable capacitors are also cooled together with the detection coils 72A and 72B and the coupling coil 74. For example, a cooling system (i.e., a cryostat cooling system) discussed in Japanese Patent Application Laid-Open No. 2014-41103 can be used as a cooling mechanism. More specifically, helium gas cooled by the cooling system 86 is introduced into a heat exchanger 100 connected to the stage 90. The heat exchanger 100 can be cooled down to an extremely low temperature (e.g., 20 k or less). Accordingly, it is feasible to cool the component to be cooled. When the detection coils 72A and 72B are cooled, the electric resistances of the detection coils 72A and 72B decrease. As a result, the detection sensitivity in the NMR measurement can be improved. Although not illustrated in the drawings, the NMR probe 64 includes a temperature sensor capable of detecting the temperature of the component to be cooled.

When the above-mentioned NMR apparatus 58 uses the detection coils 72A and 72B manufactured according to the manufacturing method described in the present embodiment, the surface resistance of the detection coils 72A and 72B in the static magnetic field can be lowered. Therefore, the detection sensitivity can be improved.

As illustrated in FIG. 12, the detection coils 72A and 72B are usable as a pair of detection coils. In this case, manufacturing the detection coils 72A and 72B together according to the manufacturing method described in the present embodiment is advantageous in that the film quality of the superconductive thin film becomes uniform. Accordingly, the manufactured detection coils 72A and 72B can possess similar characteristics. For example, as illustrated in FIG. 2A-2E, the superconductive thin-film layer is formed on the substrate 12 and the superconductive thin-film layer is fine processed to obtain a pair of detection coils 72A and 72B. Through the processing, a superconductive thin-film layer having the shape of the detection coil 72A and a superconductive thin-film layer having the shape of the detection coil 72B can be formed together. After the fine processing, the insulating protective layer is formed on both of the superconductive thin-film layers. Subsequently, the superconductive thin-film layers are irradiated together with ions. Accordingly, as the detection coils 72A and 72B can be simultaneously manufactured under the same conditions (under the same environment), similarity in characteristics between manufactured detection coils 72A and 72B is excellent as compared to a case where the detection coils 72A and 72B are manufactured separately. Further, it is feasible to easily manufacture the detection coils 72A and 72B possessing the same characteristics.

Modified Embodiment 1

Figure 13:
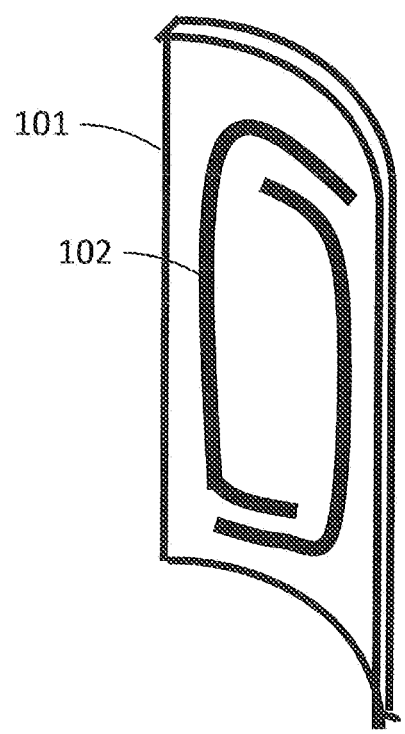
FIG. 13 is a perspective view illustrating a detection coil for magnetic resonance measurement according to a modified embodiment 1.

Hereinafter, a detection coil for magnetic resonance measurement according to a modified embodiment 1 will be described with reference to FIG. 13. FIG. 13 illustrates an exemplary detection coil for magnetic resonance measurement according to the modified embodiment 1.

In the modified embodiment 1, a superconductive thin-film layer 102 having a detection coil shape is formed on a curved substrate 101. The substrate 12 described in the above-mentioned embodiment can be replaced by the curved substrate 101. The curved substrate 101 is, for example, a flexible substrate. The curved substrate 101 can be constituted, for example, by YSZ or sapphire whose thickness is equal to or less than 0.1 mm. The superconductive thin-film layer 102 is comparable to the superconductive thin-film layer 24 described in the above-mentioned embodiment. The superconductive thin-film layer 102 contains the pinning formed therein by ion irradiation, similar to the superconductive thin-film layer 24. Although not illustrated in FIG. 13, the modified embodiment 1 is similar to the above-mentioned embodiment in that the insulating protective layer 26 is formed on the superconductive thin-film layer 102.

Manufacturing processes required before bending the detection coil are similar to those illustrated in FIG. 2A-2E. The manufacturing method further includes bending the curved substrate 101 after completing the ion irradiation so that a face on which the superconductive thin-film layer 102 is formed faces inward. Thus, it is feasible to form an entirely curved detection coil. Accordingly, a curved type detection coil; namely, a three-dimensional detection coil, can be formed.

A pair of curved type detection coils (i.e., the detection coils described in the modified embodiment 1) can be manufactured and disposed in the NMR probe 64, similar to the detection coils 72A and 72B illustrated in FIG. 12.

Using the curved type detection coils (i.e., the three-dimensional detection coil) according to the modified embodiment 1 can improve the detection sensitivity of the NMR apparatus. It is believed that the Q values of the planar type detection coil (i.e., a two-dimensional detection coil) and the curved type detection coil (i.e., a three-dimensional detection coil) are similar to each other. On the other hand, the filtering factor of the curved type detection coil is greater than that of the planar type detection coil. Therefore, it can be concluded that using the curved type detection coil can improve the detection sensitivity of the NMR apparatus, as compared to a case where the planar type detection coil is used.

Figure 14:
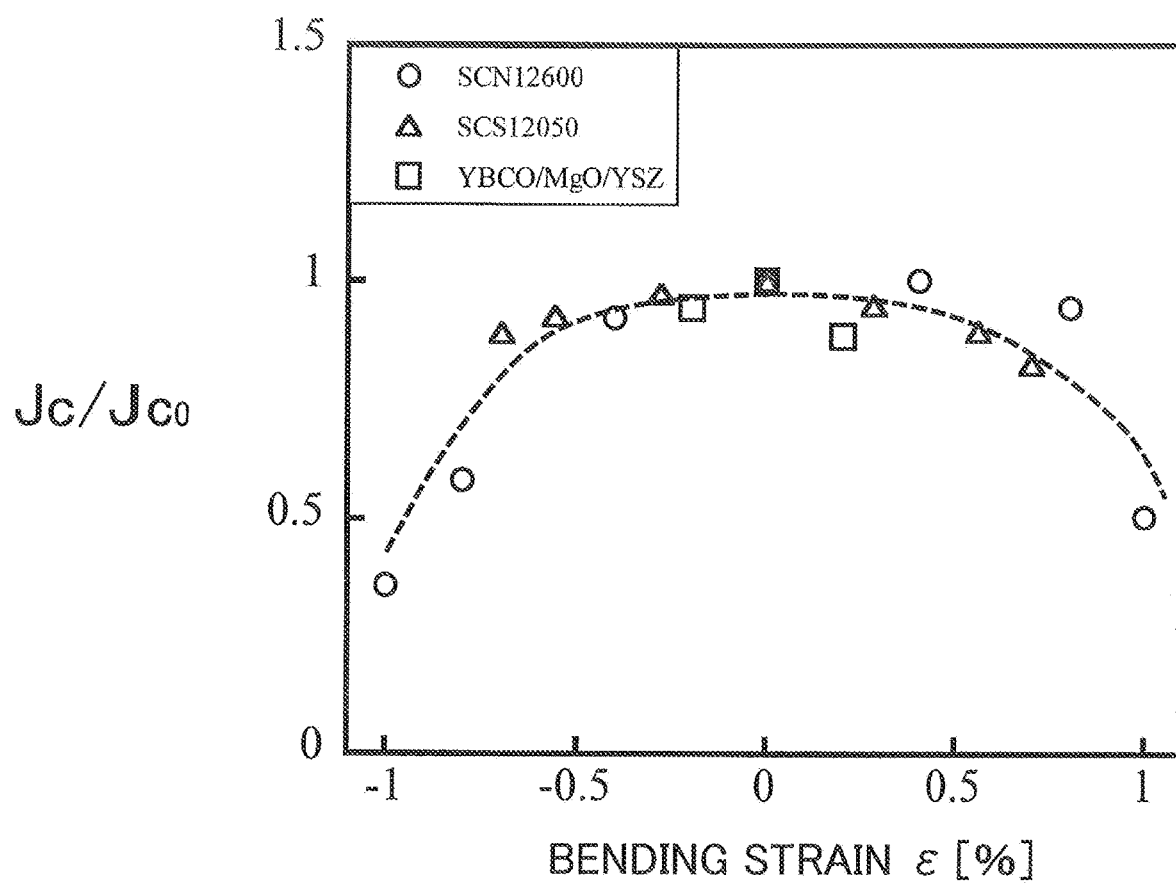
FIG. 14 is a graph illustrating a relationship between bending strain and critical current density.

Even when the detection coil has a curved shape, it can be evaluated that the surface resistance of the detection coil does not vary, because the critical current density does not vary. FIG. 14 is a graph illustrating a relationship between bending strain and critical current density. In the illustrated graph, the horizontal axis indicates bending strain ε [%] and the vertical axis indicates normalized critical current density ($J_c/J_{c0}$). The plus side of the bending strain corresponds to the tensile stress, and the minus side corresponds to the compressive stress. It can be understood that the critical current density does not vary even when a tensile or compressive strain of approximately 0.5% occurs.

Modified Embodiment 2

Figure 15:
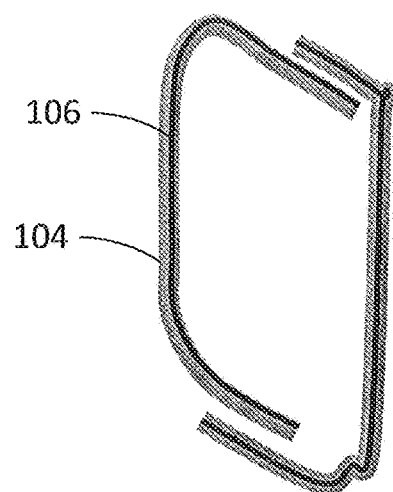
FIG. 15 is a perspective view illustrating a detection coil for magnetic resonance measurement according to a modified embodiment 2.

Hereinafter, a detection coil for magnetic resonance measurement according to a modified embodiment 2 will be described with reference to FIG. 15. FIG. 15 illustrates an exemplary detection coil for magnetic resonance measurement according to the modified embodiment 2.

In the modified embodiment 2, a superconductive thin-film layer 106 having a detection coil shape is formed on a processed substrate 104 having the detection coil shape. The superconductive thin-film layer 106 is comparable to the superconductive thin-film layer 24 described in the above-mentioned embodiment. The superconductive thin-film layer 106 contains the pinning formed therein by ion irradiation, similar to the superconductive thin-film layer 24. Although not illustrated in FIG. 15, the modified embodiment 2 is similar to the above-mentioned embodiment in that the insulating protective layer 26 is formed on the superconductive thin-film layer 106.

In the modified embodiment 2, a non-magnetic metal substrate is used instead of the substrate 12 described in the above-mentioned embodiment. The thickness of the metal substrate is, for example, 0.01 mm. The manufacturing method according to the modified embodiment 2 includes performing ion irradiation, similar to the manufacturing process illustrated in FIG. 2A-2E, and subsequently cutting the metal substrate (i.e., the substrate corresponding to the substrate 12) by wire cutting or electric discharge machining along the superconductive thin-film layer 106 having the detection coil shape. FIG. 15 illustrates the metal substrate having been cut as the processed substrate 104. The width of the processed substrate 104 can be wider than or equal to that of the superconductive thin-film layer 106. The manufacturing method includes further processing the processed substrate 104 into a line width that has no influence on the NMR measurement. If there is no substantial influence on the NMR measurement, it will be unnecessary to process the metal substrate into a thin line (i.e., the processed substrate 104).

The manufacturing method includes bending the processed substrate 104 after completing the processing of the metal substrate, so that a surface on which the superconductive thin-film layer 106 is formed faces inward. Thus, it is feasible to form an entirely curved detection coil. Accordingly, a curved type detection coil; namely, a three-dimensional detection coil, can be formed.

A pair of curved type detection coils (i.e., the detection coils according to the modified embodiment 2) can be manufactured and disposed in the NMR probe 64, similar to the detection coils 72A and 72B illustrated in FIG. 12.

Using the curved type detection coil (i.e., the three-dimensional detection coil) according to the modified embodiment 2 can improve the detection sensitivity of the NMR apparatus, similar to the curved type detection coil according to the modified embodiment 1.

Further, because the substrate used in the modified embodiment 2 is the metal substrate, it is feasible to manufacture a coil having, for example, a saddle shape, because the coil can be shaped using an appropriate technique (e.g., wire cutting or electric discharge machining).

The invention claimed is:

1. A method for manufacturing a detection coil for magnetic resonance measurement, comprising:
    forming a superconductive thin-film layer on a substrate;
    processing the superconductive thin-film layer into a shape of the detection coil for magnetic resonance measurement, the shape of the detection coil including an inductance element and a capacitance element; and
    irradiating the shape-processed superconductive thin-film layer with ions.

2. The method for manufacturing the detection coil for magnetic resonance measurement according to claim 1, wherein an insulating protective layer is formed on the shape-processed superconductive thin-film layer before ion irradiation.

3. The method for manufacturing the detection coil for magnetic resonance measurement according to claim 1, wherein the shape-processed superconductive thin-film layer is irradiated with ions and then an insulating protective layer is formed on the irradiated superconductive thin-film layer.

4. The method for manufacturing the detection coil for magnetic resonance measurement according to claim 2, wherein the insulating protective layer is a resin layer.

5. The method for manufacturing the detection coil for magnetic resonance measurement according to claim 2, wherein the insulating protective layer is formed on the entire surface of the superconductive thin-film layer.

6. The method for manufacturing the detection coil for magnetic resonance measurement according to claim 1, wherein a metal protective layer is formed on the superconductive thin-film layer before shape processing, processing the metal protective layer and the superconductive thin-film layer into the shape of the detection coil, and subsequently peeling off the shape-processed metal protective layer.

7. The method for manufacturing the detection coil for magnetic resonance measurement according to claim 1, wherein the superconductive thin-film layer formed on the substrate is processed into a shape of a pair of detection coils, and two of the shape-processed superconductive thin-film layers are irradiated together with ions in such a way as to form a pair of detection coils for magnetic resonance measurement.

8. The method for manufacturing the detection coil for magnetic resonance measurement according to claim 1, wherein a group of randomly and three-dimensionally dispersed defects is formed in the shape-processed superconductive thin-film layer by ion irradiation.

9. The method for manufacturing the detection coil for magnetic resonance measurement according to claim 1, wherein the substrate is bent after the shape-processed superconductive thin-film layer is irradiated with ions, to form a three-dimensional detection coil.

* * * * *